(12) United States Patent
Kossel et al.

(10) Patent No.: US 11,916,568 B2
(45) Date of Patent: Feb. 27, 2024

(54) SAMPLING CIRCUIT WITH A HIERARCHICAL TIME STEP GENERATOR

(71) Applicant: INTERNATIONAL BUSINESS MACHINES CORPORATION, Armonk, NY (US)

(72) Inventors: Marcel A. Kossel, Reichenburg (CH); Pier Andrea Francese, Adliswil (CH); Abdullah Serdar Yonar, Zurich (CH); Mridula Prathapan, Adliswil (CH); Thomas Morf, Switzerland (CH)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 17/652,960

(22) Filed: Mar. 1, 2022

(65) Prior Publication Data

US 2023/0283290 A1 Sep. 7, 2023

(51) Int. Cl.
*H03M 1/50* (2006.01)
*H03K 5/135* (2006.01)

(52) U.S. Cl.
CPC ............. *H03M 1/50* (2013.01); *H03K 5/135* (2013.01)

(58) Field of Classification Search
CPC ....... H03M 1/50; H03M 1/1215; H03K 5/135
USPC ........................................................ 341/166
See application file for complete search history.

(56) References Cited

U.S. PATENT DOCUMENTS

| 8,325,076 | B2 | 12/2012 | Yousif | |
|---|---|---|---|---|
| 8,564,348 | B1 * | 10/2013 | Staszewski | ........... H03L 7/0996 327/158 |
| 8,786,472 | B1 | 7/2014 | Prince | |
| 8,970,419 | B2 | 3/2015 | Farley | |
| 9,503,115 | B1 | 11/2016 | Shin | |
| 9,831,888 | B1 | 11/2017 | Waltari | |
| 2006/0161614 | A1 | 7/2006 | Vashishta | |
| 2007/0009066 | A1 | 1/2007 | Fredriksson | |
| 2011/0286510 | A1 * | 11/2011 | Levantino | .............. H03B 27/00 327/156 |

(Continued)

OTHER PUBLICATIONS

Baert et al., "A 5-GS/s 7.2-ENOB Time-Interleaved VCO-Based ADC Achieving 30.5 fJ/cs," IEEE Journal of Solid-State Circuits, vol. 55, Issue 6, Jun. 2020, pp. 1577-1587. <https://ieeexplore.ieee.org/stamp/stamp.jsp?tp=&arnumber=8946584>.

(Continued)

*Primary Examiner* — Jean B Jeanglaude
(74) *Attorney, Agent, or Firm* — Grant M. McNeilly

(57) ABSTRACT

A hierarchical time step generator circuit is configured to be used for a time-based analog-to-digital converter. The hierarchical time step generator is configured to generate multiphase clock signals in response to receiving a reference clock signal. The time-based analog-to-digital converter is configured to be controlled to digitize the input signal by the multiphase clock signals. The hierarchical time step generator includes a first level time step generator configured to generate the a set of first level multiphase signals in response to receiving the reference clock signal a phase interpolator circuit configured as second level to generate second level clock signals between each of the first level clock signals and a third level configured to generate the third set of multiphase clock signals using a set of time staggered multi-phase phase locked loops synchronized to each of the second level clock signals.

20 Claims, 6 Drawing Sheets

(56) References Cited

U.S. PATENT DOCUMENTS

| | | |
|---|---|---|
| 2012/0013493 A1 | 1/2012 | Kato |
| 2013/0093470 A1* | 4/2013 | Lin .......................... H03L 7/16 |
| | | 327/107 |
| 2020/0059239 A1 | 2/2020 | Deutscher |
| 2020/0119835 A1 | 4/2020 | Etezadi |
| 2022/0069852 A1 | 3/2022 | Harada |

OTHER PUBLICATIONS

Bernard, et al., "Adaptive LUT-based system for in situ ADC auto-correction." Published Jul. 2010 by Research Gate, 7 pages. DOI:10.1109/IMS3TW.2010.5502995.

Chandrasekaran et al., "A Digital PLL Based 2nd-Order ΔΣ Bandpass Time-Interleaved ADC," 2018 IEEE 61st International Midwest Symposium on Circuits and Systems (MWSCAS), Aug. 5-8, 2018, pp. 286-289. <https://ieeexplore.ieee.org/document/8623928>.

Cheng et al., "A Time-to-Digital Converter Using Multi-Phase-Sampling and Time Amplifier for All Digital Phase-Locked Loop," IEEE, Jan. 2010, pp. 285-288. <https://www.researchgate.net/publication/232650181>.

Hassan et al., "A 1 GS/s 6-bit Time-Based Analog-to-Digital Converter (T-ADC) for Front-End Receivers," 2017 IEEE 60th International Midwest Symposium on Circuits and Systems (MWSCAS), Aug. 6-9, 2017, pp. 1605-1608. <https://ieeexplore.ieee.org/document/8053245>.

Kalcher, "Time-based ADCs' by Michael Kalcher," Tu Graz, Jan. 14, 2016, 21 pages. <http://workinprogress.abstractimpact.net/Time-Based%20ADCs.pdf>.

Kim et al., "A Time-Based Analog-to-Digital Converter Using a Multi-Phase Voltage-Controlled Oscillator," 2006 IEEE International Symposium on Circuits and Systems (ISCAS), May 21-24, 2006, pp. 3934-3937. <https://ieeexplore.ieee.org/document/1693489>.

Yu et al., "A 4-GS/s 39.9-dB SNDR 11.7-mW Hybrid Voltage-Time Two-Step ADC With Feedforward Ring Oscillator-Based TDCs," IEEE Journal of Solid-State Circuits, vol. 55, Issue 7, Jul. 2020, pp. 1807-1818. <https://ieeexplore.ieee.org/stamp/stamp.jsp?tp=&arnumber=9082177>.

Miyahara, et al., "22.6 A 2.2GS/s 7b 27.4mW time-based folding-flash ADC with resistively averaged voltage-to-time amplifiers." Published Feb. 9, 2014 by IEEE. 3 pages. In 2014 IEEE International Solid-State Circuits Conference Digest of Technical Papers (ISSCC), pp. 388-389. doi: 10.1109/ISSCC.2014.6757482.

Miyashita et al., "A-104 dBc/Hz In-Band Phase Noise 3 GHZ All Digital PLL with Phase Interpolation Based Hierarchical Time to Digital Converter," Jun. 2012, IEICE Transactions on Electronics, vol. E95-C, No. 6, 1 page. <https://www.researchgate.net/publication/252029936_A_-104_dBcHz_In-Band_Phase_Noise_3_GHz_All_Digital_PLL_with_Phase_Interpolation_Based_Hierarchical_Time_to_Digital_Converter>.

Naraghi, "Time-Based Analog to Digital Converters," University of Michigan, 2009, 118 pages. <https://deepblue.lib.umich.edu/bitstream/handle/2027.42/64787/naraghi_1.pdf?sequence=1>.

Sall, et al., "A study of digital decoders in flash analog-to-digital converters." Published Sep. 3, 2004 by IEEE. 4 pages. In 2004 IEEE International Symposium on Circuits and Systems (IEEE Cat. No. 04CH37512). DOI: 10.1109/ISCAS.2004.1328148.

Shao et al., "A low jitter, low spur multiphase phase-locked loop for an IR-UWB receiver," Journal of Semiconductors, vol. 31, No. 8, Aug. 2010, 6 pages. <https://www.researchgate.net/publication/231099535>.

Sinha, Sayantan. "Implementation of an 8-bit ADC using successive subtraction technique." Published Sep. 14, 2017 by IEEE. 4 pages. In IEEE Instrumentation & Measurement Magazine (vol. 20, Issue: 5). DOI: 10.1109/MIM.2017.8036696.

Straayer, "Fundamentals of Time-Based Circuits," Maxim Integrated, 2017, 76 pages. <http://site.ieee.org/scv-sscs/files/2017/08/TimeBased_Maxim_ALL.pdf>.

Yang et al., "An 8-bit 2.8 GS/s Flash ADC with Time-based Offset Calibration and Interpolation in 65 nm CMOS," ESSCIRC 2019—IEEE 45th European Solid State Circuits Conference (ESSCIRC), Sep. 23-26, 2019, pp. 305-308. <https://ieeexplore.ieee.org/stamp/stamp.jsp?tp=&arnumber=8902814>.

Yang, Xi. "Flash analog-to-digital converters with time-based techniques." Published Sep. 2019 by MIT Libraries. 116 pages. https://dspace.mit.edu/handle/1721.1/124097.

Yenduri et al., "A Low-Power Compressive Sampling Time-Based Analog-to-Digital Converter," IEEE Journal on Emerging and Selected Topics in Circuits and Systems, vol. 2, Issue 3, Sep. 2012, pp. 502-515. <https://ieeexplore.ieee.org/document/6341093>.

Yi et al., "A 15.1-mW 6-GS/s 6-bit Single-Channel Flash ADC With Selectively Activated 8× Time-Domain Latch Interpolation," IEEE Journal of Solid-State Circuits vol. 56, Issue 2, Feb. 2021, pp. 455-464. <https://ieeexplore.ieee.org/stamp/stamp.jsp?tp=&arnumber=9179766>.

Yi et al., "A 4-GS/s 11.3-mW 7-bit Time-Based ADC With Folding Voltage-to-Time Converter and Pipelined TDC in 65-nm CMOS," IEEE Journal of Solid-State Circuits, vol. 56, Issue 2, Feb. 2021, pp. 465-475. <https://ieeexplore.ieee.org/stamp/stamp.jsp?tp=&arnumber=9212427>.

Zhang et al., "An 8-Bit 10-GS/s 16×Interpolation-Based Time-Domain ADC With<1.5-ps Uncalibrated Quantization Steps," IEEE Journal of Solid-State Circuits, vol. 55, Issue 12, Dec. 2020, pp. 3225-3235. <https://ieeexplore.ieee.org/stamp/stamp.jsp?tp=&arnumber=9165099>.

List of IBM Patents or Patent Applications Treated as Related, Mar. 1, 2022, 2 pgs.

Kossell, et al., "Analog-To-Digital Converter Circuit With a Nested Look up Table," U.S. Appl. No. 17/652,957, filed Mar. 1, 2022.

* cited by examiner

SAMPLING CIRCUIT WITH A HIERARCHICAL TIME STEP GENERATOR

BACKGROUND

The present disclosure relates to the digitization of analog signals.

The digitization of an input signal may be performed by an analog-to-digital converter (ADC). One parameter of the quality of the digitization is how accurately the ADC samples the input signal in time.

SUMMARY

In one aspect the disclosure provides for a sampling circuit that is configured for digitizing an input signal. The sampling circuit comprises a time-based analog-to-digital converter. The sampling circuit comprises a hierarchical time step generator. The hierarchical time step generator may also be referred to as a global sampling phase generator. The hierarchical time step generator is configured to generate multiphase clock signals in response to receiving a reference clock signal.

The time-based analog-to-digital converter is configured to be controlled to digitize the input signal by the multiphase clock signals from the hierarchical time step generator. The hierarchical time step generator comprises a first level comprising a time step generator configured to generate first level clock signals in response to receiving the reference clock signal. The hierarchical time step generator further comprises a second level comprising a phase interpolator circuit configured to generate second level clock signals between each of the first level clock signals. The hierarchical time step generator further comprises a third level comprising a device sampling phase generator configured to generate the multiphase time signals using a set of time-staggered multi-phase phase locked loop circuits synchronized to each of the second level clock signals.

According to a further aspect of the present disclosure, the disclosure provides for a digital sampling oscilloscope configured for receiving the input signal. The digital sampling oscilloscope comprises the sampling circuit.

According to a further aspect of the present disclosure, disclosure provides for a telecommunications receiver circuit configured for receiving the input signal. The telecommunications receiver circuit comprises the sampling circuit.

DETAILED DESCRIPTION

Figure 1:
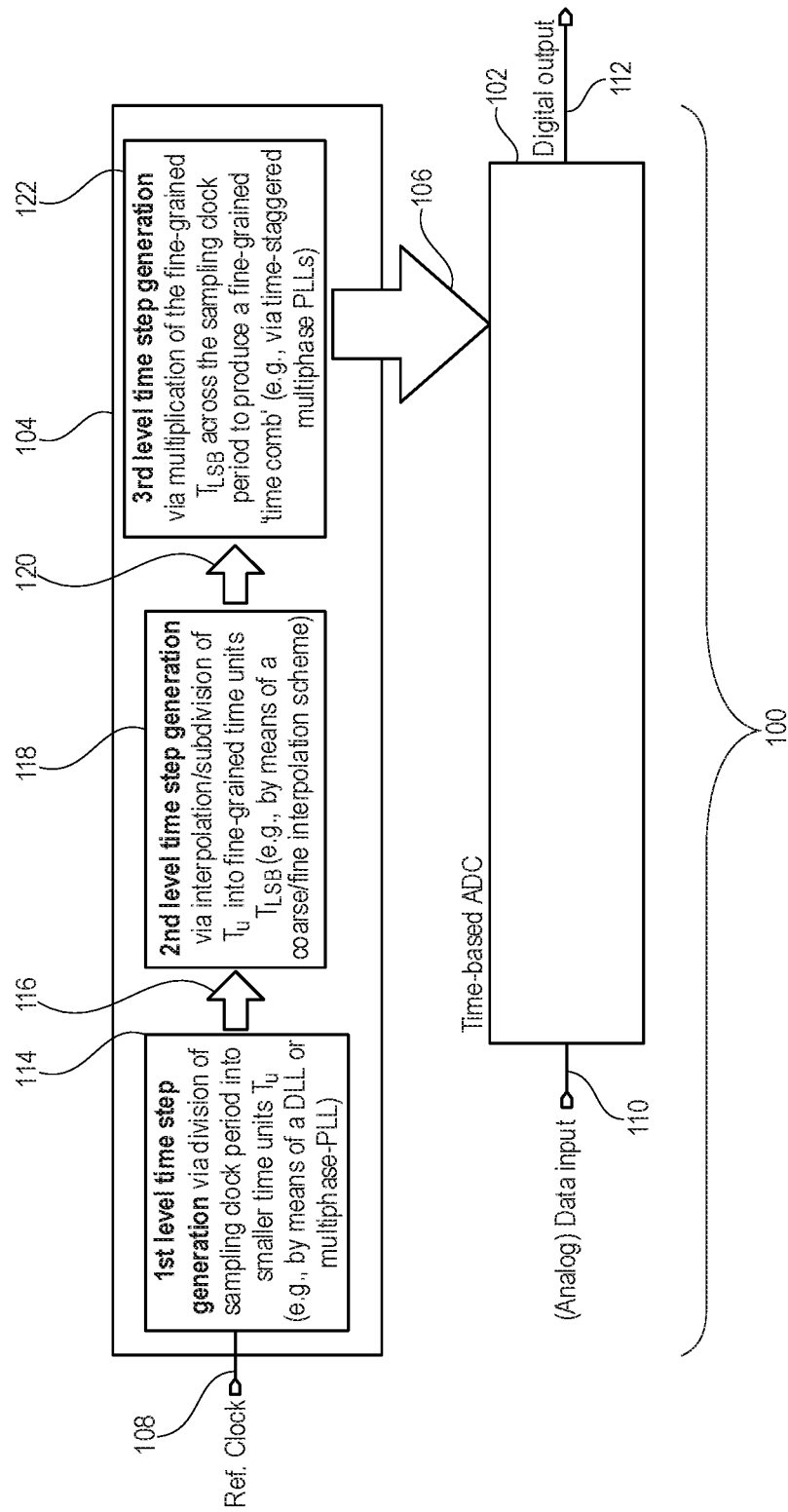
FIG. 1 illustrates a block diagram of a hierarchical time step generator and an analog-to-digital converter.

The descriptions of the various embodiments of the present disclosure will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments may be beneficial because they may be able to produce a large number of multiphase clock signals that have a defined phase relationship between them. This means that the hierarchical time step generator provides finer-grained sampling phases than the reference clock signal, leading to a higher conversion rate in the analog-to-digital converter.

Different types of time-based analog-to-digital converters may be used that may be controlled in different ways. In some instances, the time-based analog-to-digital converter is controlled completely by the multiphase clock signals. In other examples the multiple device clock signals as well as the multiphase clock signals may be used for at least partially controlling the time-based analog-to-digital converter.

In another embodiment the hierarchical time step generator is configured to perform a hierarchical time-step generation based on the incoming single-phase reference clock signals via coarse and fine phase interpolation. For example, the coarse interpolation may be provided by a first level time-step generator such as a delay-locked-loop circuit or a multiphase phase-locked-loop circuit that generates coarse-grained phases of the reference clock signal. The fine phase interpolation may be provided by a phase interpolator that takes adjacent phase pairs generated by the precedent coarse interpolator to produce finer-grained phases via phase interpolation techniques. Finally, the output signals of the phase interpolator are fed to a bank of phase-locked-loop circuits that perform a replication or multiplication in the time-domain of the fine-grained phases so that their combined outputs span the original reference clock cycle with the resolution of the fine-grained phase interpolation.

In another embodiment each of the set of time-staggered multiphase phase-locked loops (PLLs) comprises a loop filter. The set of multiphase PLLs is configured such that a first multiphase PLL (the main PLL) has a complete loop filter whereas all other multiphase PLLs (the dependent PLLs) share the integrator portion of that first multiphase PLL. The use of the shared integration portion may be beneficial because it may reduce the overall silicon area of the set of time-staggered multi-phase PLLs. Moreover, it may increase the intra-PLL matching because there is only one integration portion instead of many that need to be matched.

In another embodiment the shared integration portion is a shared capacitor. This may be particularly beneficial because capacitors can take up a relatively large portion of the area in a microchip. The use of a shared capacitor, as was mentioned before, may reduce the size of the circuit.

In another embodiment each of the set of time-staggered multiphase PLLs comprises a main PLL and dependent PLLs adapted to be controlled by the main PLL. This embodiment may be beneficial because the use of the main PLL to control the dependent PLLs may improve the quality of the multiphase clock signals.

In another embodiment the time-step generator is a delay locked loop configured for generating the first level clock signals in response to receiving the reference clock signal. This embodiment may be beneficial because the use of the delay locked loop may provide for a very stable set of first level clock signals. The delay locked loop circuit subdivides the reference clock cycle into as many phases as there are delay cells in a delay line of the delay locked loop circuit.

In another embodiment the time-step generator is a multiphase locked loop circuit configured for generating the first level clock signals in response to receiving the reference clock signal. If the multiphase PLL is used in the first level of the hierarchical time-step generation, it provides the coarse phase interpolation with the same phase resolution as the DLL while employing the phase locking operation instead of the delay locking operation. If the multiphase PLL is used in the third level of the hierarchical time-step generation, it takes one of the outputs of the fine interpolation performed in the second level of the hierarchical time step generator and generates a multiphase signal that spans over the reference clock cycle. If this time-step multiplication provided by the multiphase PLLs is performed for all outputs of the fine interpolation of the second level, the assembly of multiphase PLL outputs is again a multiphase signal that spans over a reference clock cycle with the resolution of the fine phase interpolation multiplied by the number of multiphase PLL outputs.

In another embodiment the time-step generator comprises a ring oscillator. The ring oscillator comprises multiple delay cells configured to form a ring. Each of the multiple delay cells is configured for receiving a delay tuning voltage configured to tune the timing of the first level clock signals. The sampling circuit may provide for a means of providing the delay tuning voltage such as a voltage generator and a memory or storage which is used to provide the delay tuning voltage. This may for example enable tuning of the time-step generator during calibration.

The ring oscillator may be made up of a string of delay cells that are closed to form a ring. The individual delays of the delay cells may sum up to the period of the oscillation frequency. This then may get phase and frequency locked to the reference frequency by a regulation loop, which is referred to as phase-lock loop. In the examples described herein there may not be a feedback divider or pre-scalar within the PLL and hence the frequency of the reference frequency signal corresponds to the frequency of the multiphase output signal.

In another embodiment the multiple delay cells are differential delay cells.

In another embodiment the phase interpolator circuit comprises a network of coarse interpolator circuits and fine interpolator circuits. For example, there may be two layers of coarse interpolator circuits followed by a layer of fine interpolator circuits.

In another embodiment the course interpolator circuits are formed from tunable in-series pass-gates. The delay tuning voltage may be used for tuning these tunable in-series pass-gates.

In another embodiment the fine interpolator circuits are formed from tunable in-series pass-gates. Likewise, the delay tuning voltage may be used for tuning the tunable in-series pass-gates.

In another embodiment the course interpolator circuits are formed from CML-to-CMOS converters with trip-point tuning. The delay tuning voltage may be used for controlling the trip-point tuning.

In another embodiment the fine interpolator circuits are formed from CML-to-CMOS converters with the trip-point tuning. Likewise, the delay tuning voltage may be used for controlling the trip-point tuning. CML stands for current-mode-logic and CMOS stands for complementary metal oxide semiconductor.

In another embodiment the network of coarse interpolator circuits and fine interpolator circuits comprises a first layer of coarse interpolator circuits that feeds a second layer of coarse interpolator circuits. The second layer of coarse interpolator circuits feed an output layer formed from the fine interpolator circuits. The output of the fine interpolator circuits may be the second level clock signals. This embodiment may be beneficial because it provides the time-staggered reference clocks for the third level of the hierarchical time-step generator.

In another embodiment the time-based analog-to-digital converter comprises a sampler circuit configured for receiving the input signal and for outputting to a voltage-to-time converter. The sampler circuit may sample the voltage and then this is provided to the voltage-to-time converter. The time-based analog-to-digital converter is configured to be controlled by the multiphase signal generated by the hierarchical time step generator. There may for example be multiple sampler circuits and which sampler circuit is engaged may for example be determined by the multiphase signal of the hierarchical time step generator. The time-based analog-to-digital converter further comprises a voltage-to-time converter configured to receive the output of the sampler circuit. The time-based analog-to-digital converter further comprises a time-to-digital converter configured to output a digital signal in response to receiving the output of the voltage-to-time converter and the multiphase clock signals.

In another embodiment the time-based analog-to-digital converter comprises multiple sub-analog-to-digital converters. Each of the multiple sub-analog-to-digital converters comprises a sampler circuit, a voltage-to-time converter, and a time-to-digital converter. The sampler circuit is configured for receiving the input signal and outputting the voltage-to-time converter. The voltage-to-time converter is configured to receive the output of the sampler circuit. The time-based analog-to-digital converter further comprises a time-to-digital converter configured to output an additional signal in response to receiving the output of the voltage-to-time converter and the multiphase clock signals. The use of the multiple sub-analog-to-digital converters may help increase the conversion rate of the overall analog-to-digital converter.

In another embodiment the hierarchical time step generator further comprises a multiphase 1/2-divider circuit configured for generating time interleaving signals in response to receiving the reference clock signal. The sampler circuit is configured to be controlled by the reference clock signal.

In another aspect the disclosure provides for a digital sampling oscilloscope configured for receiving the input signal. The digital sampling oscilloscope comprises the sampling circuit according to an embodiment. This may be beneficial because it may provide for a digital sampling oscilloscope with increased bandwidth and increased accuracy in the timing for the measurement for the input signal.

In another aspect the disclosure provides for a telecommunications receiver circuit configured for receiving the input signal. The telecommunications receiver circuit comprises the sampling circuit of an embodiment. This may be beneficial because it may provide for a telecommunications receiver that for example has a reduced amount of jitter and increased bandwidth.

FIG. 1 illustrates an example of a sampling circuit 100. The sampling circuit 100 is shown as comprising a time-based analog-to-digital converter 102 and a hierarchical time step generator 104. The hierarchical time step generator 104 provides multiphase clock signals 106 to the time-based analog-to-digital converter 102 in response to receiving a reference clock signal 108. The time-based analog-to-digital converter 102 receives the input signal 110 and outputs a digital output 112, which represents the digitized input signal. The multiphase clock signals 106 are used to control the time-based analog-to-digital converter.

The hierarchical time step generator 104 is shown as receiving the reference clock signal 108 as input which is then input into a first level 114 of the hierarchical time-step generator 104. The first level 114 is configured to generate a first level clock signals 116 in response to receiving the reference clock signal 108 at its input. The first level 114 can be considered to be a first level time-step generation via the division of the reference clock 108 into smaller time units $T_u$. This for example could be in different examples by means of a DLL or multi-phase PLL. The first level clock signals 116 are shown as being input into a phase interpolator circuit 118, which is the second level of the hierarchical time step generator 104.

The phase interpolator circuit 118 may be considered to be a second level time-step generation via interpolation and sub-division of the $T_u$ into fine-grained time units $T_{LSB}$. This is for example by means of a coarse and fine interpolation scheme in different examples. The output of the phase interpolator circuit 118 are second level clock signals 120. These are input into a third level 122. The third level 122 outputs the multiphase clock signals 106 in response to receiving the second level clock signals 120. The third level 122 can be considered to be a third level time-step generation via the multiplication of the fine-grained $T_{LSB}$ across the sampling clock period to produce fine-grained multiphase clock signal 106. The multiphase clock signals 106 are sometimes referred to herein as a time comb. One way of implementing the third level 122 is via the use of time-staggered multi-phase locked loops or PLLs.

Figure 2:
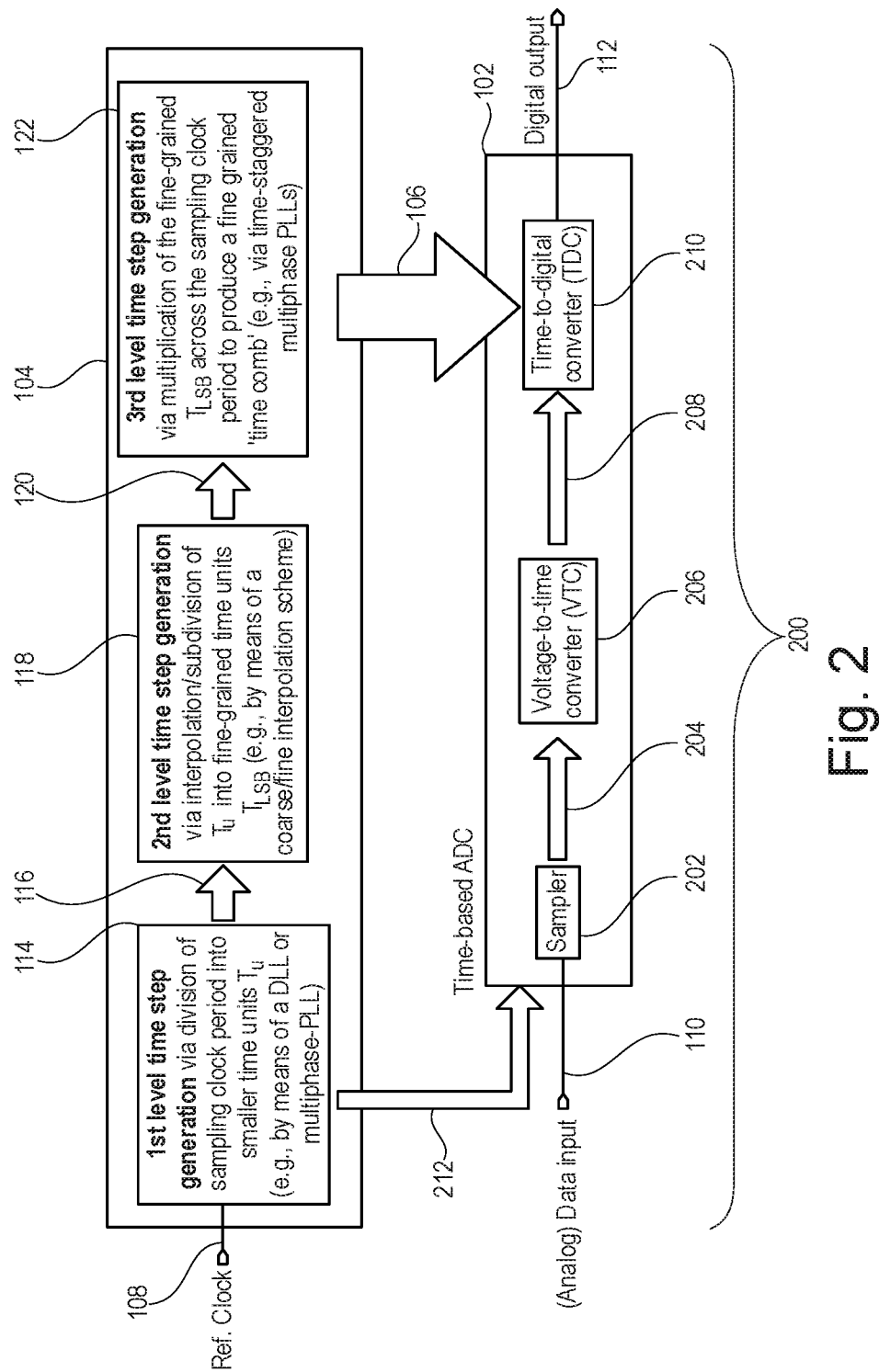
FIG. 2 illustrates a further example of a hierarchical time step generator and an analog-to-digital converter.

FIG. 2 illustrates a further example of a sampling circuit 200. The sampling circuit 200 in FIG. 2 is similar to the sampling circuit 100 in FIG. 1 with several additions. In this example there are additionally time interleaving signals 212 which are provided by the hierarchical time step generator 104. The time interleaving signals 212 are provided as an additional control to the time-based analog-to-digital converter. The time interleaving signals 212 in some examples could be identical with the first level clock signals 116 or could be provided by a different component within the hierarchical time step generator 104. The multiphase clock signals 106 are also shown as being a direct control for a time-to-digital converter 210.

The input 110 for the time-based analog-to-digital converter 102 is shown as being connected to a sampler 202. The sampler 202 may be a voltage sampler. The output of the sampler circuit 204 is connected to a voltage-to-time converter 206. The output of the voltage-to-time converter 208 is input into the time-to-digital converter 210 which was previously mentioned as being controlled by the multiphase clock signals 106. The output of the time-to-digital converter 210 is the digital output 112 or the digitized input signal.

Figure 3:
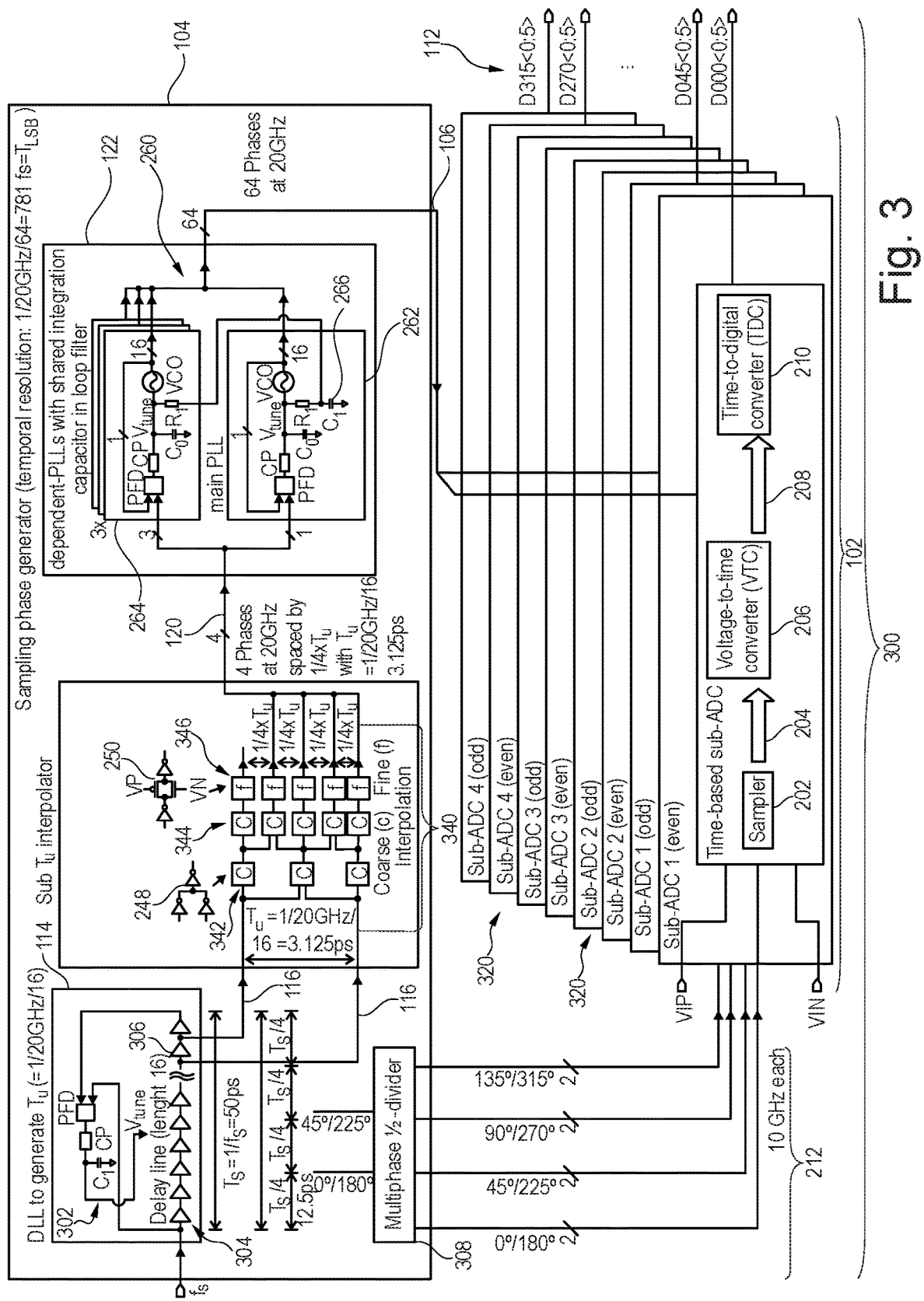
FIG. 3 illustrates a further example of a hierarchical time step generator and an analog-to-digital converter.

FIG. 3 illustrates a further example of a sampling circuit 300. The sampling circuit 300 in FIG. 3 shows greater detail than that as was illustrated in FIG. 1 or 2. The time-step generator 114 is shown as being implemented as a DLL or a delay locked loop 302. The delay locked loop 302 comprises a delay line 304 made up of a series of delay cells 306. Pairs of signals on either side of the delay cell 306 are used to provide the first level clock signals 116. This implementation is shown as comprising a multi-phase 1/2-divider 308 that provides a number of time interleaving signals 212. In this example, the 1/2-divider produces quadrature signals at fs/2. The time interleaving signals 212 are quadrature signals that control the time-interleaving of the sub-ADCs at half the speed of $f_s$ (the speed off the reference clock signal).

Half the speed for the interleaving may be beneficial because the multiphase signals span across a full $f_s$-cycle but the VTC within the sub-ADC needs to regenerate and hence this allows for additional regeneration time, which is done easiest when operating at half rate.

In some examples the time interleaving signals 212 could be identical with the multiphase signals 116 or the time interleaving signals 212 could be a subset of the multiphase signals 116.

The time interleaving signals 212 are shown as being provided to the time-based analog-to-digital converter 102. In this case the time-based analog-to-digital converter 102 is shown as comprising a number of sub-analog-to-digital converters 320. The time interleaving signals 212 are used to select which sub-analog-to-digital converter 320 is active. Hence it performs time-interleaving. The multiphase clock signals 106 are provided to each of the sub-analog-to-digital converters 320.

The time-step generator 114 is shown as providing the first level clock signals 116 to the phase interpolator circuit 118 as was previously depicted. In this example an exemplary network 340 of coarse interpolator circuits and fine interpolator circuits is illustrated. There is a first layer of coarse interpolator circuits 342 that receives the first level clock signals 116 and feeds into a second layer of coarse interpolator circuits 344. The second layer of coarse interpolator circuits 344 feed into an input layer of fine interpolator circuits 346 which then outputs the second level clock signals 120. In this example, the fine interpolator circuits are in-series pass-gates 248. They may have a tuning circuit. The alternative implementation of fine interpolator circuits is shown as being CML-to-CMOS converters 250. They may have trip-point tuning.

The third level 122 of the hierarchical time-step generator 104 is shown as being formed from a group of time-staggered multi-phase PLLs 260. This group of PLLs comprises a main PLL 262 and a group of dependent PLLs 264. All of the phase lock loops 260 comprise a shared integration capacitance 266. This helps save area in the hierarchical time step generator 104 as well as increasing how well the time-staggered multi-phase PLLs 260 lock together.

The multiphase clock signals may be generated using one or more of the following features to provide sampling clock generation of time-based sub-ADC using:
   a) a DLL (first level 114) to divide sampling clock cycle $T_s$ (reference clock signal 108) into N time intervals $T_u$ (e.g., $f_s$=20 GHz->$T_u$=1/20 GHz/16=3.125ps)
   b) phase interpolator (second level or phase interpolator circuit 118) further dividing $T_u$ into M fine-grained time intervals via coarse and fine interpolation (e.g., $T_u$/4)
   c) Fine interpolation via either i) tuning of in-series pass-gate 248 or ii) duty-cycle adjustable CML-to-CMOS converter 250 (duty cycle distortion is irrelevant because of sequential PFD in successive PLLs that focus on rising edge only).
   d) fine-grained phases (e.g., at multiples of $T_u$/4) multiplied to N phases (e.g., 16 phases spaced by $T_s$/16 and offset by $T_u$/4) by multiphase-PLLs. The aggregation of all multiphases constitute the sampling phases for the sub-ADC. This is referred to here as a 'time comb' or multiphase clock signals 106.

e) multiphase-PLLs with shared integrator part in loop filter (i.e., shared integration in PI-regulation) in order to save silicon area and improve matching between time-staggered PLLs.

The sub-ADCs (320) may comprise one or more of the following features:

f) sampling switches (operated at $f_s$), voltage-to-time converter (VTC) and time-to-digital converter (TDC).

Figure 4:
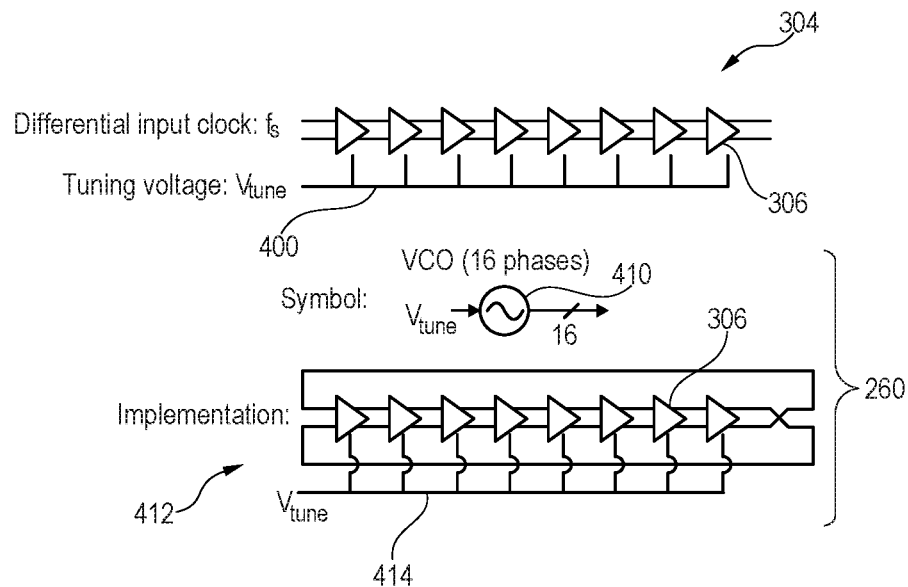
FIG. 4 illustrates the construction of a ring oscillator and a delay line based on delay cells.
Figure 4:
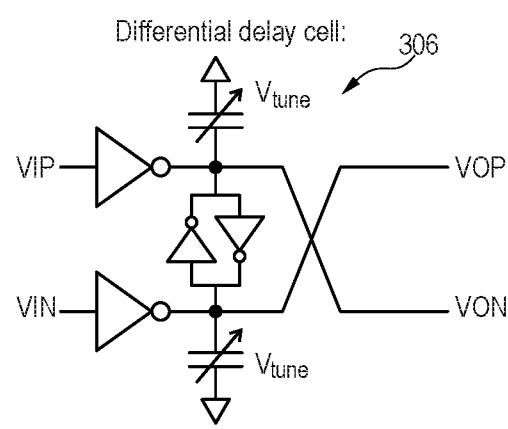

FIG. 4 illustrates examples of the delay line 304 for the DLL of the first level 114 in the hierarchical time-step generator 104 as well as the ring oscillator 412 for the time-staggered multi-phase PLLs 260 that occur in the third level 122 of the hierarchical time-step generator 104. In the top portion of the Figure shows the delay line where a tuning voltage 400 is used to control the delay cells 306.

Below this some components of the time-staggered multi-phase PLLs 260 are shown. There is a voltage-controlled oscillator 410 based on a ring oscillator 412, which generates 16 phases. The ring oscillator 412 is comprised of the same delay cells 306 as in the delay line 304 and again have a tuning voltage 414 for tuning the delay cells 306.

Below these is shown an example of an implementation of a delay cell 306. It is shown how the tuning voltage 400 or 414 can be used to adjust the capacitance and adjust the differential delay cells 306.

Figure 5:
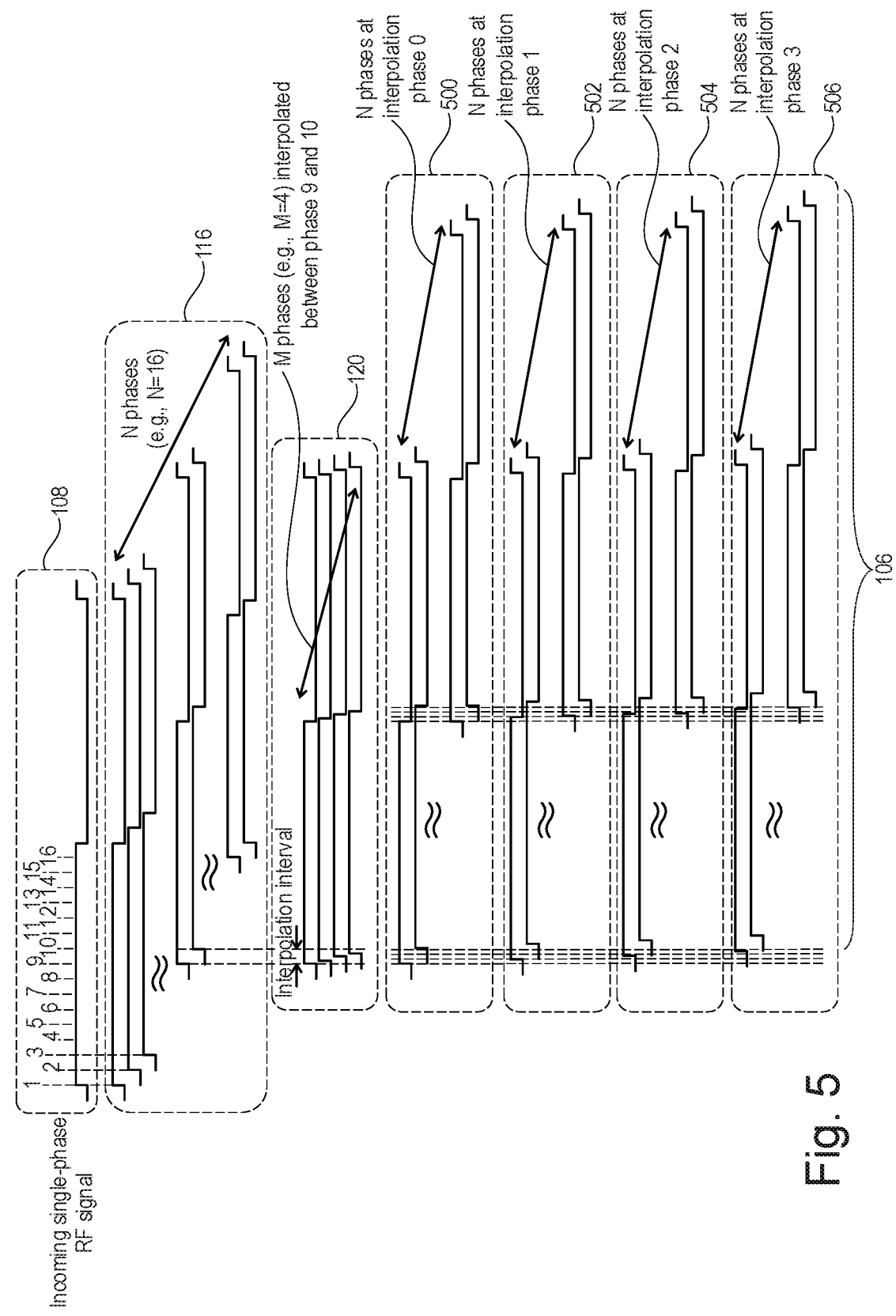
FIG. 5 shows a timing diagram which illustrates the construction of multiphase timing signals by a hierarchical time step generator.

FIG. 5 illustrates a timing diagram which illustrates the construction of the multiphase clock signals 106. At the top of the timing diagram there is a box labeled 108 and this represents the reference clock signal. The reference clock signal could be an incoming single-phase RF signal. The time-step generator according to the first level 114 is then used to generate the first level clock signals within the box 116.

Adjacent pairs of the first level clock signals 116 are each fed to their own phase interpolator circuit 118 which then outputs second level clock signals 120. This signal processing occurs in the second level 118 of the hierarchical time-step generator 104. Essentially for each of the first level clock signals 116 there are a number of interpolated signals illustrated in box 120. The phase interpolator generates M phases via interpolation of two adjacent DLL phase signals.

The boxes labeled 500, 502, 504, and 506 represent the output of the time-staggered multi-phase PLLs 260. The signal processing here occurs in the third level 122 of the hierarchical time-step generator 104. Box 500 is the output of the main phase-locked loop 262. The main phase-locked-loop (PLL) circuit 262 generates N phases based on the $1^{st}$ interpolated signal used as reference signal for the main PLL 266.

Box 502 shows the output of the first dependent PLL circuit, which generates N phases based on the $2^{nd}$ interpolated signal used as a reference signal. Box 504 shows the output of the second dependent PLL circuit, which generates N phases based on the $3^{rd}$ interpolated signal. Box 506 shows the output of the third dependent PLL circuit, which generates N phases based on the $4^{th}$ interpolated signal used as a reference signal. Therefore, for each signal in the second level clock signals 120 there are end phases which are interpolated using a time-staggered multi-phase PLL 260. The signals in boxes 500, 502, 504, and 506 are combined into the multiphase clock signals. The reassembly of the M×N phase signal is such that they are ordered in time to be used to control the sampling within the DAC 102. The M×N signals represent the multiphase signals 106 of the hierarchical time-step generator 104 and they span over a clock cycle of the reference clock 108 with a resolution of 1/(M× N) of that clock cycle.

Figure 6:
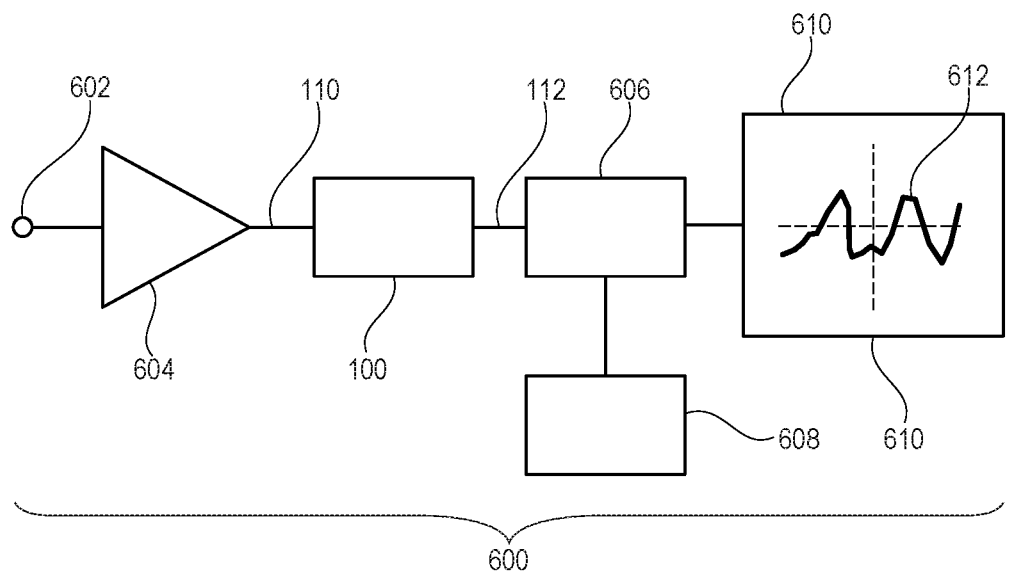
FIG. 6 illustrates an example of a digital sampling oscilloscope.

FIG. 6 illustrates a functional diagram of a digital sampling oscilloscope 600. The digital sampling oscilloscope 600 has an input 602 which is then connected to a signal processing unit 604 which may provide for such things as amplification and/or filtering of the input 602. The output of the signal processing device 604 is considered the input signal 110 which is then fed to the sampling circuit 100. The output of the sampling circuit 100 is connected for example to a computational device 606. The computational device 606 is connected to a user interface 608 which enables a user to control the operation and function of the digital sampling oscilloscope 600. The computational device 606 also controls a display 610 which displays a representation 612 of the input signal 110.

Figure 7:
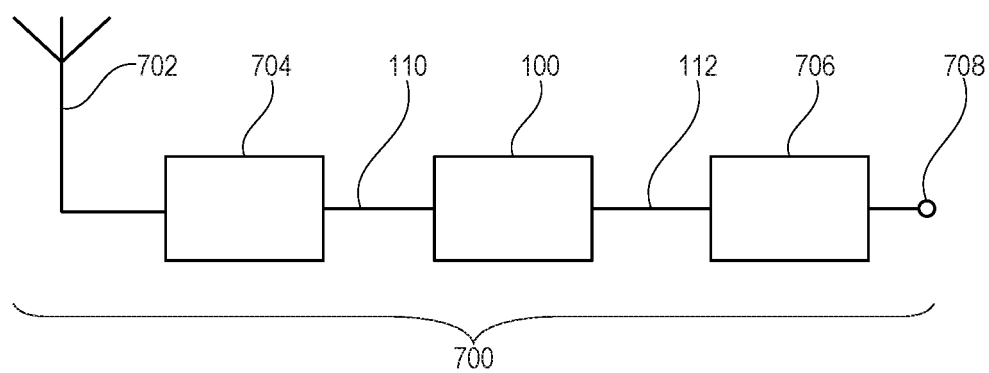
FIG. 7 illustrates an example of a telecommunications receiver circuit.

FIG. 7 illustrates an example of a telecommunications receiver circuit 700. This is shown as comprising an antenna 702 which is connected to a signal conditioning circuit 704. This may contain such things as filtering, amplification or even a matching network. The output of the signal conditioning circuit 704 is considered the input signal 110 which is then fed to the sampling circuit 100. The digitized signal which comes out of the sampling circuit 100 is fed to a DSP system 706 for processing. The DSP system 706 outputs a communication signal 708.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A sampling circuit configured for digitizing an input signal, wherein said sampling circuit comprises:
    a time-based analog-to-digital converter; and
    a hierarchical time step generator comprising multiple levels, wherein said hierarchical time step generator is configured to generate multiphase clock signals in response to receiving a reference clock signal, wherein said time-based analog-to-digital converter is configured to be controlled to digitize said input signal by said multiphase clock signals from said hierarchical time step generator;
    wherein said hierarchical time step generator comprises:
    a first level comprising a time step generator configured to generate first level clock signals in response to receiving said reference clock signal;
    a second level comprising a phase interpolator circuit configured to generate multiple second level clock signals between each of said multiple first level clock signals; and
    a third level comprising a device sampling phase generator configured to generate said multiphase clock signals using a set of time staggered multi-phase phase locked loops synchronized to each of said second level clock signals.

2. The sampling circuit of claim 1, wherein said hierarchical time step generator is configured to perform a hierarchical time-step generation of said multiphase clock signals via coarse and fine phase interpolation.

3. The sampling circuit of claim 1, wherein each set of time-staggered multi-phase PLLs each comprise a loop filter, wherein said loop filter of each set of said time-staggered multi-phase PLLs comprises a shared integration portion.

4. The sampling circuit of claim 3, wherein said shared integration portion is a shared capacitor.

5. The sampling circuit of claim 3, wherein each set of said time-staggered multi-phase PLLs comprise a main PLL and dependent PLLs adapted to be controlled by said main PLL.

6. The sampling circuit of claim 1, wherein said time step generator is a delay locked loop configured for generating said first level clock signals in response to receiving said reference clock signal.

7. The sampling circuit of claim 1, wherein said time step generator is a multi-phase phase locked loop configured for generating said multiphase signals in response to receiving said reference clock signal.

8. The sampling circuit of claim 1, wherein said time step generator comprises a ring oscillator wherein said ring oscillator comprises multiple delay cells, wherein each of said multiple delay cells is configured for receiving a delay tuning voltage configured to tune timing of said first level clock signals.

9. The sampling circuit of claim 8, wherein said multiple delay cells are differential delay cells.

10. The sampling circuit of claim 1, wherein said phase interpolator circuit comprises a network of coarse interpolator circuits and fine interpolator circuits.

11. The sampling circuit of claim 10, wherein said coarse interpolator circuits and/or said fine interpolator circuits are formed from tunable in-series pass-gates.

12. The sampling circuit of claim 10, wherein said coarse interpolator circuits and/or said fine interpolator circuits are formed from CML to CMOS converters with trip-point tuning.

13. The sampling circuit of claim 10, wherein said network of coarse interpolator circuits and fine interpolator circuits comprises a first layer of coarse interpolator circuits that feeds a second layer of coarse interpolator circuits, wherein said second layer of course interpolator circuits feeds an output layer formed from said fine interpolator circuits.

14. The sampling circuit of claim 1, wherein said time-based analog-to-digital converter comprises a sampler circuit configured for receiving said input signal and output to a voltage to time converter, wherein said time-based analog-to-digital converter further comprises a voltage-to-time converter configured to receive said output of said sampler circuit, wherein said time-based analog-to-digital converter further comprises a time-to-digital converted configured to output a digital signal in response to receiving said output of said voltage-to-time converted and said multiphase clock signals.

15. The sampling circuit of claim 14, wherein the hierarchical time step generator further comprises a multiphase 1/2-divider circuit configured for generating time interleaving signals in response to receiving the reference clock signal, wherein herein said sampler circuit is configured to be controlled by said reference clock signal.

16. The sampling circuit of claim 1, wherein said time-based analog-to-digital converter comprises multiple sub analog-to-digital converters, wherein said each of said multiple sub analog-to-digital converters comprises a sampler circuit, a voltage-to-time converter, and a time-to-digital converter, wherein said sampler circuit is configured for receiving said input signal and outputting to said voltage-to-time converter, wherein said voltage-to-time converter configured to receive said output of said sampler circuit, wherein said time-based analog-to-digital converter further comprises a time-to-digital converted configured to output a digital signal in response to receiving said output of said voltage-to-time converted and said multiphase clock signals.

17. The sampling circuit of claim 16, wherein the hierarchical time step generator further comprises a multiphase 1/2-divider circuit configured for generating time interleaving signals in response to receiving the reference clock signal, wherein herein said sampler circuit is configured to be controlled by said reference clock signal.

18. A digital sampling oscilloscope configured for receiving an input signal, wherein said digital sampling oscilloscope comprises:
a signal processing unit;
a sampling circuit connected to the signal processing unit;
a computational device connected to the sampling circuit;
a user interface connected to the computational device; and
a display connected to the computational device;
wherein the sampling circuit comprises:
a time-based analog-to-digital converter; and
a hierarchical time step generator comprising:
a first level comprising a time step generator configured to generate first level clock signals in response to receiving said reference clock signal;
a second level comprising a phase interpolator circuit configured to generate multiple second level clock signals between each of said multiple first level clock signals; and
a third level comprising a device sampling phase generator configured to generate said multiphase clock signals using a set of time staggered multi-phase phase locked loops synchronized to each of said second level clock signals.

19. The digital sampling oscilloscope of claim 18, wherein said hierarchical time step generator of said sampling circuit is configured to perform a hierarchical time-step generation of said multiphase clock signals via coarse and fine phase interpolation.

20. A telecommunications receiver circuit configured for receiving an input signal, wherein said telecommunications receiver circuit comprises:
a signal conditioning circuit;
a sampling circuit connected to the signal conditioning circuit; and
a digital signal processor connected to the sampling circuit;
wherein the sampling circuit comprises:
a time-based analog-to-digital converter; and
a hierarchical time step generator comprising:
a first level comprising a time step generator configured to generate first level clock signals in response to receiving said reference clock signal;

a second level comprising a phase interpolator circuit configured to generate multiple second level clock signals between each of said multiple first level clock signals; and a third level comprising a device sampling phase generator configured to generate said multiphase clock signals using a set of time staggered multiphase phase locked loops synchronized to each of said second level clock signals.

\* \* \* \* \*